United States Patent [19]
Lambert

[11] Patent Number: 5,119,011
[45] Date of Patent: Jun. 2, 1992

[54] BATTERY STATE OF CHARGE INDICATOR

[75] Inventor: Joe C. Lambert, Mebane, N.C.

[73] Assignee: General Electric Company, New York, N.Y.

[21] Appl. No.: 564,258

[22] Filed: Aug. 8, 1990

[51] Int. Cl.⁵ .......................... H02J 7/00; G08B 21/00
[52] U.S. Cl. ..................................... 320/43; 318/139;
320/48; 324/431; 340/636
[58] Field of Search ........................ 320/43, 44, 48;
324/427, 431; 318/139; 340/636

[56] References Cited

U.S. PATENT DOCUMENTS

| | | | |
|---|---|---|---|
| 4,021,718 | 5/1977 | Konrad | 320/48 |
| 4,180,770 | 12/1979 | Eby | 320/48 X |
| 4,234,840 | 11/1980 | Konrad et al. | 320/48 |
| 4,320,334 | 3/1982 | Davis et al. | 320/48 |
| 4,333,149 | 6/1982 | Taylor et al. | 364/481 |
| 4,377,787 | 3/1983 | Kikuoka et al. | 324/431 |
| 4,390,841 | 6/1983 | Martin | 324/427 |
| 4,394,741 | 7/1983 | Lowndes | 364/483 |
| 4,573,126 | 2/1986 | Lefebvre et al. | 364/481 |
| 4,876,513 | 10/1989 | Brilmyer et al. | 320/48 X |
| 4,912,416 | 3/1990 | Champlin | 320/48 X |

Primary Examiner—R. J. Hickey
Attorney, Agent, or Firm—Richard A. Menelly; Fred Jacob

[57] ABSTRACT

A method for measuring and storing the state of charge of batteries, such as used in electric vehicles. The stored charge value is initially derived from the value of battery terminal voltage measured prior to connection of the battery to the load, e.g. the traction motor. While the battery is connected to the load, approximated state of charge values are periodically derived by adding a correction voltage, comprising the product of measured load current and of a predetermined value of internal resistance, to the measured terminal voltage of the battery. The stored and approximated state of charge values are periodically compared and the stored state of charge value is decremented by a predetermined increment in response to the stored charge value having exceeded the approximated state of charge value during each of a predetermined plurality consecutive comparisons.

10 Claims, 7 Drawing Sheets

BATTERY STATE OF CHARGE INDICATOR

BACKGROUND OF THE INVENTION

This invention relates to battery monitoring apparatus and more particularly to a battery state of charge indication system.

Storage batteries are used in numerous applications where it is important to know the amount of available energy remaining in the battery. For example, the battery state of charge is a critical parameter in the operation of battery energized electrically propelled traction vehicles, such as electric cars and forklift trucks. Such vehicles must rely on the energy stored in the on board batteries for propulsion. Stored energy must be replaced by special equipment which is only available at a charging station. Thus means for indicating the energy state of the remaining battery charge can be advantageously used by the vehicle operator to ensure that the vehicle is returned to the charging station before the battery has been completely discharged. It is important that such a state of charge indicator system provide a continuous and sufficiently accurate state of charge output even during normal operation, i.e. when the battery is connected to its load circuit and is supplying current. In the case of a battery energized vehicle, this permits the operator to continuously monitor the state of charge and to perform his mission until the batteries have been discharged to a desired level.

Numerous systems have heretofore been used or proposed for indicating the energy remaining in a battery or detecting a low battery condition under normal load operation. For example, lead acid batteries contain an electrolyte, generally dilute sulphuric acid, whose specific gravity decreases as the battery is discharged. Thus specific gravity provides a direct indication of charge. Specific gravity metering devices can provide an indication of the electrolyte condition of a battery cell. However, it is difficult to utilize such devices to monitor the state of a multi cell battery or of the plurality of batteries that are commonly used to energize loads.

Some battery condition monitors and state of charge indicating systems rely on the terminal voltage of the batteries. The open circuit voltage of a battery depends on the specific gravity of the electrolyte in contact with the active material of the battery. The terminal voltage is, of course, more readily measured than specific gravity. As a battery is discharged, its terminal voltage decreases. Specifically the cell voltage, i.e. the battery terminal voltage divided by the number of battery cells, decreases as the battery is discharged. Some battery condition monitors activate a voltage level switch when the battery terminal voltage drops below a preset voltage level (usually 80-85% of nominal voltage). If the battery voltage remains below this level for a preset time, e.g. 15-30 seconds, an indicating lamp is energized. After a further preset time interval, a specific work function is disabled, thereby forcing the operator to return to the charging station. However, such arrangements are believed to be inexact and the voltage trip point level and the time delays must be adjusted by trial and error. This system also does not provide a continuous indication of the state of charge so that the low charge indication will often catch the operator by surprise.

It is obviously desirable to convert sequential measurements of battery terminal voltage into indications of the state of charge that are continuous and accurate. However, this is difficult to achieve. The electromotive force of a battery, i.e. the open circuit voltage of a battery, is linearly related to the specific gravity of the electrolyte and thus provides a direct indication of the charge of a battery. However, when the battery is connected to a load and discharge current flows, the terminal voltage of the battery is reduced below the value of the open circuit voltage. Specifically terminal voltage is not solely a function of the state of charge. It is highly depended on the value of the load current. The cell voltage varies inversely with load, i.e. discharge, current, such that cell voltage drops substantially when the discharge current is substantially increased. The voltage differential, occuring in a fully charged battery, between no load and full load current can exceed the voltage differential, occuring at no load current, between a fully charged and a fully discharged battery. Additionally the rate at which the voltage decreases with increases in load current may vary with different types of batteries. For example the rate may be greater for a small capacity battery, such as an 11 plate 425 ampere hour battery, as opposed to one with higher capacity such as a 15 plate 595 ampere hour battery. Further, the terminal voltage may be affected by battery aging, particularly at very high load currents. Also on termination of discharge current, the terminal voltage rises only gradually to its true open circuit voltage.

The difference between the battery terminal voltage under no load and load conditions has been attributed to the depletion of active ions at reaction sites in the battery and identified as the polarization voltage. It has also been generally attributed to the internal resistance of the battery. This internal resistance includes the resistance of internal parts such as terminal posts, ground straps, plate lugs and grids, the active material, e.g. lead peroxide, separators, electrolyte and the contact resistance between the surface of the active material and the electrolyte.

Various design compromises are used to provide and update an approximated indication of state of charge during normal operation. Exemplary are the systems disclosed in U.S. Pat. Nos. 4,021,718-Konrad; 4,234,840-Konrad et al; and 4,320,334-Davis et al, all of which are assigned to the assignee of the subject patent. The arrangement disclosed in referenced patent U.S. Pat. No. 4,021,718 overcomes variations in terminal voltage due to variations in discharge current. The state of charge is updated when, and only when, the discharge current is of one predesignated value, e.g. 200 amperes. State of charge is then updated, based on the correlation existing between the drop in terminal voltage at a specified level of battery discharge current and the specific gravity of the battery's electrolyte. However, many types of battery energized systems, such as electric vehicles, have frequent and large variations of discharge current. Since a specified single value of discharge current, e.g. 200 amps, might occur only infrequently, the state of charge indication would only be updated sporadically. Also the indicated state of charge may be subject to some undesirable variations, since it is derived from the most recent measurement of terminal voltage, taken at the specified level of current. The accuracy of the indicated state of charge depends on the accuracy of this reading and on the degree of correlation between this most recent voltage measurement and the actual state of charge.

U.S. Pat. Nos. 4,234,840 and 4,320,334 also describe arrangements for updating the indicated state of charge to track the actual battery discharge. The indicated state of charge is approximated and updated substantially independently of the value of battery current. The state of charge indication is based on a stored value. Upon initial turn on of the system, this stored value is representative of actual battery voltage. It is representative of the battery voltage under no load, a value directly related to the remaining energy in the battery. During normal operation the stored value is to be reduced, e.g. by a capacitor discharge circuit, to approximately track the reduction of the anticipated no load battery terminal voltage resulting from the battery discharge currents. In the arrangement of patent −840, the stored value is reduced at a fixed predetermined rate. This fixed predetermined rate is selected to approximately correspond to the anticipated average discharge rate. While the battery is temporarily disconnected from the load, as indicated by an open circuit sensor, the stored value is reduced at a second fixed predetermined rate, so that the stored value is reduced at a lower rate during open circuit conditions. If the stored value falls below a value representative of actual battery voltage, it is rapidly increased to the latter value.

The −334 patent discloses a related arrangement intented to provide a more accurate indication of state of charge when the battery is subject to long periods of variable current drain. The stored value is decreased at a variable rate, instead of at one or two fixed rates. Specifically, the stored value is decreased at a rate proportional to the difference between the stored value and the scaled value of actual battery terminal voltage. Also if the stored value falls below a value representative of actual battery voltage, the stored value is increased at a rate representative of the difference between the stored value and the sensed value.

U.S. Pat. Nos. 4,180,770 and 4,573,126 also describe calculating the state of charge solely from values of battery terminal voltage sensed prior to and during connection of the load to the battery. The indicated state of charge also corresponds to a stored value. Initially this stored value also represents the open circuit voltage and thus provides a true indication of the initial state of charge of the battery. When a load is applied to the battery, the stored value is also reduced as a function of the difference between the stored value and the present battery terminal voltage. According to the '770 patent, the difference between the stored value and the present battery terminal voltage is integrated to provide an updated stored value, which is referred to as a "manufactured open circuit voltage value". The system described in the '126 patent also relies on periodically processing the difference between the stored value and the present battery terminal voltage to compute the equivalent of an open circuit voltage value, i.e. as was referred to above as the manufactured open circuit value. This open circuit value is stored and thus updates the previously stored value. The patent describes a method of accomplishing this. The battery terminal voltage is "scanned" at a predetermined periodicity. The terminal voltage is subtracted from the stored value of computed open circuit value. The difference voltage is processed by use of specified transfer functions and by integration to derive a E value representative of the computed drop in open circuit voltage during the time of a scan. This E value is added to the previously stored value of open circuit voltage to provide an updated stored value.

In the above described systems stored values indicative of the battery state of charge are produced solely from successively measured values of battery terminal voltage. In most of these systems the stored values are updated by integrating with time differences between the stored value and the actual value of battery terminal voltage. Battery terminal voltage is substantially affected by parameters other than the battery's actual state of charge, such as by discharge current. Thus arrangements solely dependend on successive measurements of terminal voltage would not necessarily provide accurate indications of the state of charge under conditions of substantial and random changes in battery discharge current.

Some battery state of charge indicating systems derive a value corresponding to the remaining available energy, i.e. state of charge, as follows: A value representative of the initially available energy of the battery is stored. A value representative of depleted energy is derived by integrating discharge current with time. The value of remaining energy results from subtracting the value of depleted energy from the value of available energy. The following summarizes operation of two such systems which utilize calculated values of battery resistance and of polarization voltage, respectively.

In U.S. Pat. No. 4,333,149 which is assigned to the assignee of the subject application, the battery's dynamic resistance is computed from battery voltage and current. The dynamic resistance is considered to be independent of the rate of battery discharge and thus, indicative of total battery charge capacity. The total battery charge capacity is calculated in accordance with the dynamic resistance of the battery and the battery charge delivered, i.e. the integration of battery discharge current with respect to time. The remaining state of charge of the battery is obtained by subtracting the battery charge delivered from the total battery charge.

According to U.S. Pat. No. 4,394,741, the remaining charge of the battery is derived from the battery's charge storage capacity adjusted for the charge withdrawn from the battery, i.e. the battery discharge current integrated with time. When the battery becomes substantially discharged and certain conditions are met, the battery's charge storage capacity is calculated as a function of the voltage of one of the battery's subpacks. The voltage value is compensated to take into account the electrolyte temperature and the polarization voltage—polarization voltage is calculated as a complex function of time and of peak current.

OBJECT OF THE INVENTION

It is an object of the invention to provide an improved method and apparatus for indicating the state of charge of a battery including during intervals of varying discharge current.

It is a further object to provide such an improved method and apparatus for reliably updating state of charge indications notwithstanding rapid and substantial variations of battery discharge current.

It is another object that the aforesaid method and apparatus may be readily and easily implemented in digital form, preferably with minimal hardware additional to that otherwise required to perform other functions of the battery energized system.

SUMMARY OF THE INVENTION

The above and other objects are attained in accordance with the present invention by storing as a stored value of charge a scaled value representative of open circuit battery terminal voltage. While the battery is under load the stored value of charge is decremented in response to said stored value exceeding an approximated state of charge value representative of the sum of actual battery terminal voltage and of a correction value. The correction value corresponds to the product of actual battery current and of a stored resistance value indicative of the battery's internal resistance. Preferably, the stored value is decremented by a predetermined increment when the stored value of charge has exceeded the approximated state of charge value during each of a predetermined plurality of comparisons. The stored value of charge can be supplied to display means for display of the remaining state of charge of the battery.

BRIEF DESCRIPTION OF THE DRAWINGS

While the specification concludes with claims particularly pointing out and distinctly claiming the subject matter which is regarded as the invention, it is believed that the invention will be better understood from the following description of the preferred embodiment taken in conjunction with the accompanying drawings, in which:

DETAILED DESCRIPTION

Figure 1:
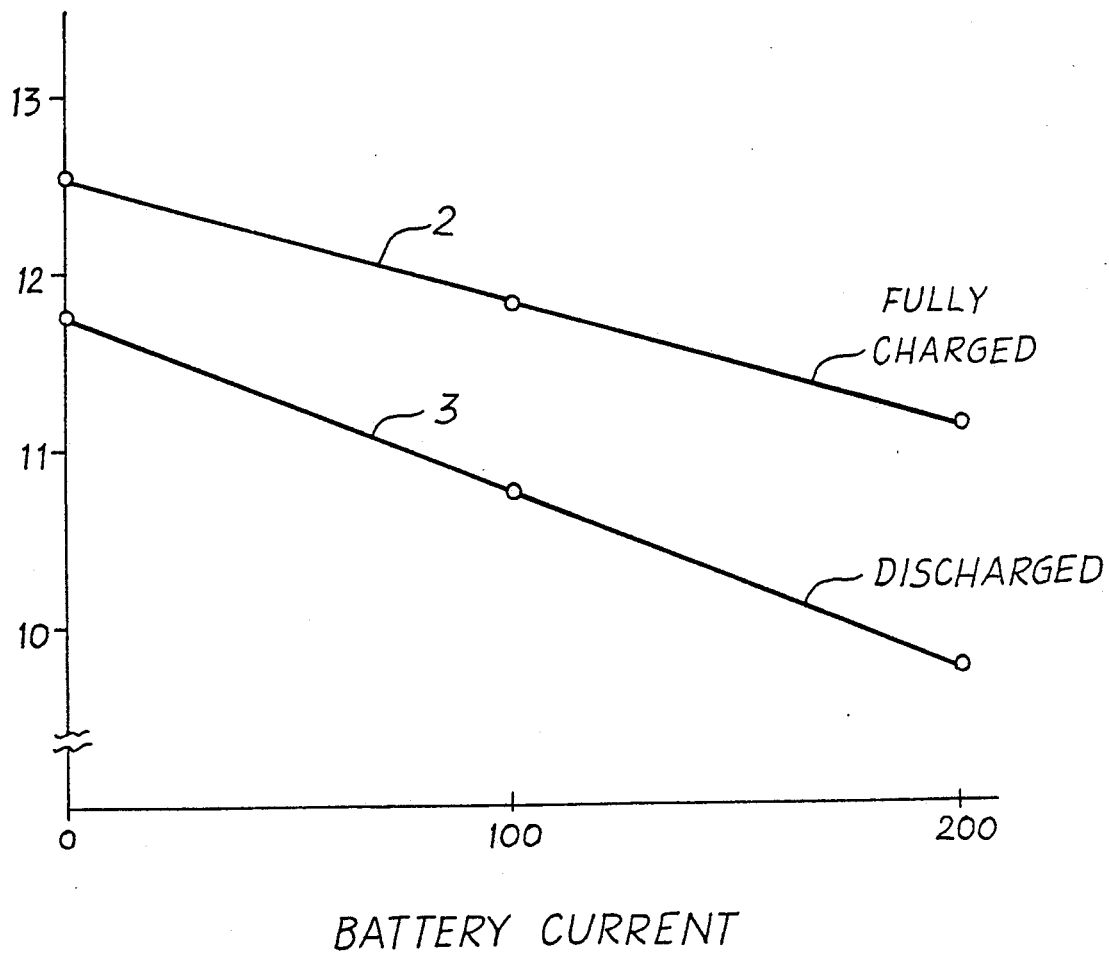
FIG. 1 is a representation of battery terminal voltage and battery current at different levels of battery charge.

It is known that the terminal voltage of a lead acid storage battery which has been in a quiescent state for an extended period of time is a good indicator of the state of charge, for example, ranging from 2.12 volts per cell when fully charged to 1.97 volts per cell when substantially discharged. Thus the state of charge of a battery which has been disconnected from its load for a suitable period of time may be detected such as by a suppressed zero voltmeter, i.e. a voltmeter scaled to display only the relevant voltage range. However, battery terminal voltage drops substantially under load, i.e. during the existence of discharge current, to a value which is representative of the magnitude of the discharge current but is not necessarily indicative of a decrease of the battery's state of charge. Further, after the discharge current terminates, the battery voltage rises only gradually to its true open circuit voltage. Thus merely measuring the voltage of batteries under open circuit conditions does not indicate the state of charge of batteries which operate under varying load conditions with infrequent intervals of no load or open circuit conditions. FIG. 1 illustrates the relationship between battery terminal voltage and battery current for a charged, and also a substantially discharged, lead acid battery. Typical voltages for a fully charged battery, represented by load line 2, are 12.55 volts at zero current, 11.73 volts at 100 amperes, and 11.15 volts at 200 amperes. When substantially discharged, as represented by load line 3, the voltage drops to about 11.75 volts at zero current, to 10.73 volts at 100 amperes and to 9.85 volts at 200 amperes. This illustrates the decrease of battery terminal voltage, representative of decreased state of charge, that occurs, under no load conditions, when the battery is discharged. It further demonstrates the inverse voltage current relationship that exists at a specified level of charge, e.g. fully charged and discharged. In the specific example the load lines, 2 and 3, for the charged and substantially discharged batteries are relatively linear and of relatively similar slope, although line 3 has a slightly greater slope.

The state of charge of a battery is obtained as follows: The battery terminal voltage is measured and a scaled value indicative of actual state of charge is stored under no load conditions, i.e. prior to connection of the battery to its load. As is well known, this stored value is indicative of the state of charge when normal operation, i.e. discharge current, commences. The stored value must then be kept updated during normal operation even though the battery terminal voltage is no longer directly representative of the state of charge. According to the present invention, the stored value is decremented in a special manner to track the decrease of the actual state of charge. The stored value is decremented in a special manner in response to this stored value exceeding an approximated value of the state of charge. This approximated state of charge value is based on a value of actual battery terminal voltage which has been modified, i.e. corrected as described below, to compensate for the drop in battery voltage due to discharge current flow. This compensation for the voltage drop due to discharge current utilizes a value representative of sensed discharge current.

It is known that when a battery supplies discharge current the battery terminal voltage decreases not only as a function of the state of charge but also as a function of the value of the battery discharge current. The drop in the actual battery terminal voltage can thus be attributed to a first voltage drop due to battery discharge, i.e. the true decrease in the state of charge, and a second voltage drop attributable to the discharge current. In accordance to the invention, a correction voltage value is derived that is indicative of this second voltage drop, i.e. the drop attributable to discharge current. This correction voltage value is added to a value representative of actual battery terminal voltage to provide a corrected value that approximates the actual state of charge. As previously described, the inverse relationship between the battery, or cell voltage and the discharge current is believed to be primarily attributable to the internal resistance of the battery. Viewed from the load of the battery, as opposed to the battery itself, the voltage drop due to discharge current is a function of the sum of the internal resistance of the battery and of the resistance of the connections between the battery and the load, e.g. cables and terminals. The term "internal resistance" here refers to some value that is indicative of, but not necessarily equal to, the sum of the aforesaid resistances. The drop in battery terminal voltage attributable to discharge current, i.e. the correction voltage, can thus be approximated by the product of the discharge current and of the internal resistance. The correction value is derived from the scaled product of measured load current and of a value that is representative of the internal resistance. In a preferred embodiment of the invention, this internal resistance value is a constant numeric value based on specific battery, cabling and load characteristics of the system. Use of a constant has been satisfactory, although actual internal battery resistance is subject to some variations, e.g. with temperature and state of charge. The magnitude of the constant internal resistance value determines the magnitude of the correction value and thus the rate at which the stored value is decremented. The constant value should thus be selected for the specific battery, load and mission such that the indicated state of charge closely conforms to the actual charge.

Sequentially the correction value is summed with the actual, i.e. present battery terminal voltage to provide the corrected value that approximates the actual state of charge, and the corrected value, i.e. approximated state of charge, is compared with the stored value. This process occurs periodically during normal operation. In the preferred embodiment it is repeated every three seconds. The stored value is decremented in response to its value exceeding that of the corrected value. However, it is desirable to defer decrementing until a number of consecutive comparisons have confirmed that the corrected value has indeed been reduced below the stored value. This avoids decrementing in response to transient values of current that produce corrected values that are in fact incorrect. In the preferred embodiment decrementing results only upon six successive comparisons that each indicate that the corrected value is lower than the stored value. Since comparison occurs every three seconds and six consecutive comparisons are required, decrementing occurs no more frequently than once every 18 seconds. This arrangement thus provides filtering adequate to compensate for transients that otherwise might provide erroneous decrementing of the indicated state of charge. Conversely the 18 second minimal interval between decrements is short in comparison with the normal time required to discharge a fully charged battery. For example a fork lift truck might be operated for three to four hours before its fully charged batteries are discharged. Up to 600 to 800 decrements could occur under the stated conditions. However, decrements will not occur at the maximum rate. In the preferred embodiment each decrement reduces the indicated state of charge by about one percent such that the system is scaled to provide for about 100 decrements between fully charged and discharged conditions. The above specified parameters can be modified for different applications.

IMPLEMENTATION IN A MICROPROCESSOR CONTROL SYSTEM

Figure 2:
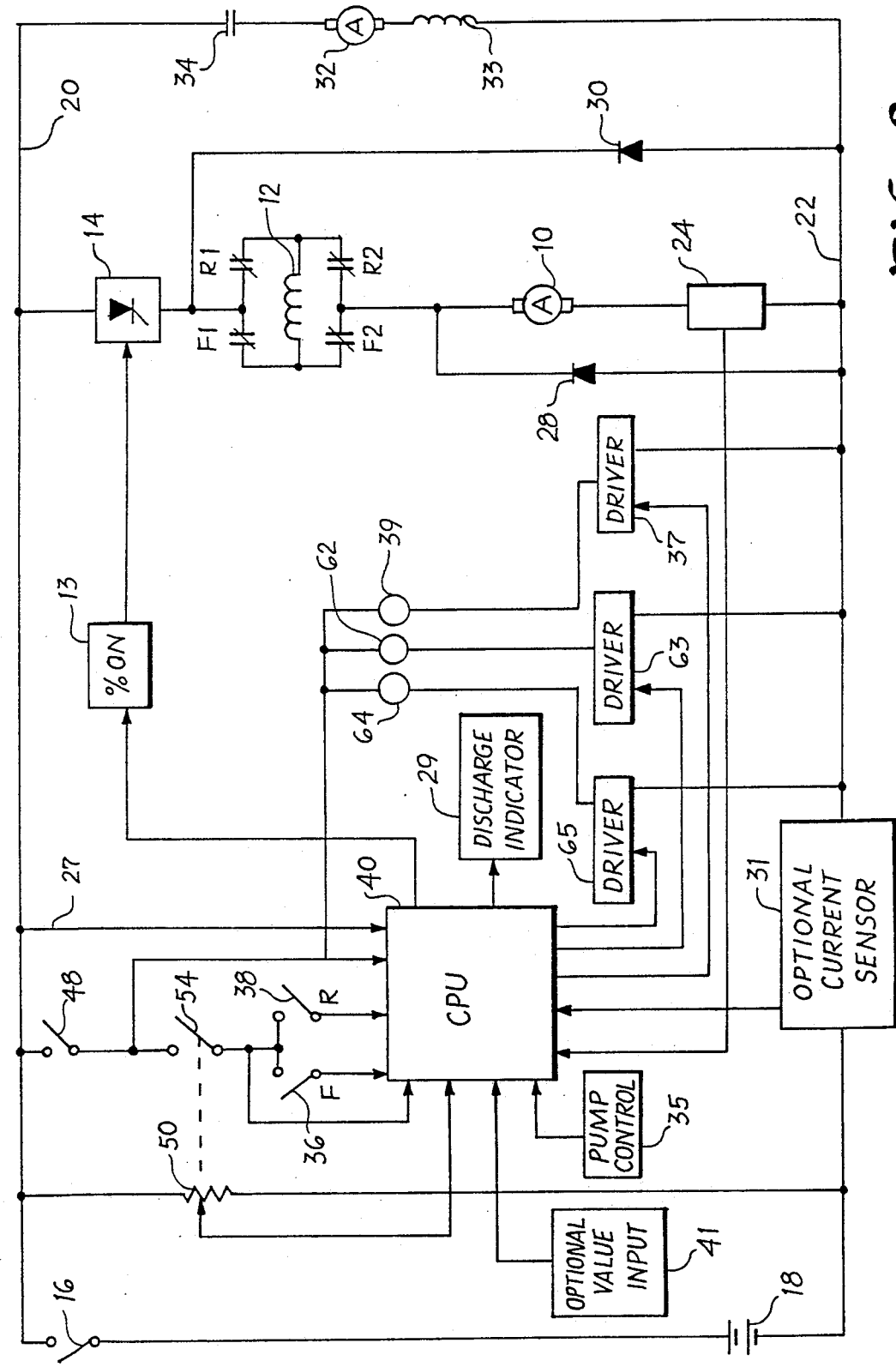
FIG. 2 is a circuit diagram of a battery load circuit incorporating the state of charge display arrangement.

The subject battery discharge indication system has been implemented in a microprocessor based control system useful for electric vehicles such as fork lift trucks, which is illustrated in FIG. 2. A microprocessor control system of this general type is disclosed in U.S. Pat. No. 4,730,151 in the name of Bernard I. Florey and Joe C. Lambert, the inventor of the subject application. This patent is assigned to the assignee of the subject application and is hereby incorporated by reference. The aforesaid patent provides detailed descriptions of the hardware and software of the microprocessor control which are useful in understanding the implementation of the subject invention.

FIG. 2 illustrates a control for electric vehicles powered by a direct current series wound traction motor. The motor is energized by electric storage batteries and its tractive effort is controlled by a chopper circuit. Although this constitutes the setting for a preferred embodiment, the invention can be used with other types of control circuits and applications. In FIG. 2 a series dc traction motor comprising an armature winding 10 and a field winding 12 is supplied with electrical power from battery 18 via a chopper circuit 14 and a key switch 16. The aforesaid components are connected in series circuit by positive bus 20 and negative bus 22. Chopper circuit 14 is controlled by a chopper control, or driver unit 13. The motor field winding 12 is arranged to be connected either in a forward or reverse direction by contacts F1, F2, R1 and R2. A current shunt 24 is connected between the armature winding 10 and the negative bus 22 to provide to microcomputer 40 a signal, Ia, indicative of the magnitude of armature current. A plugging diode 28, connected between bus 22 and a junction intermediate armature 10 and field winding 12, provides a reverse current path during plug mode type of electrical braking. A free wheeling diode 30, connected between bus 22 and a function intermediate field winding 12 and chopper circuit 14, provides a path for inductive motor current while the chopper circuit is not conducting.

The forward and reverse contacts F1, F2, R1 and R2 about field winding 12 are controlled by a microcomputer 40 based on the position of the forward and reverse switches 36 and 38, respectively. These switches are connected between bus 20 and microcomputer 40 by serially connected seat switch 48 and start switch 54. In addition the on/off states of the seat switch 48 and of the start switch 54 are communicated to microcomputer 40 by lines connected directly from each of these switches to the microcomputer. If the operator vacates his seat on the vehicle, the seat switch opens and immediately stops the vehicle. Similarly the vehicle will not start until the operator presses on the accelerator pedal so as to close start switch 54. Accelerator 50 incorporates a potentiometer whose ends are connected between busses 20 and 22. Its potentiometer arm is also connected to microcomputer 40 so as to provide an input signal indicative of the percent accelerator pedal depression. Line 27 connected from bus 20 to microcomputer 40 provides the actual battery terminal voltage which is used to calculate the state of charge of the battery.

Some electric vehicles, such as fork lift trucks, have an additional hydraulic lifting mechanism which is actuated by an electric pump motor. Such a pump motor is shown as comprising armature 32 and field winding 33 which are serially connected with pump motor contactor 34 between busses 20 and 22. Operation of the pump motor is controlled by a signal provided by pump control device 35 to microcomputer 40. As previously noted a signal representative of traction motor current is supplied by sensor 24 to the microcomputer. The output of this sensor is used for traction motor control but may also be used by the microcomputer as an indication of load current to derive the previously referenced correction signal of the battery state of charge indicator. In applications wherein battery load is not limited to the traction motor current, an additional current sensor 31 may be connected in bus 22 to measure the total battery discharge current. In the system of FIG. 2, the output of sensor 31 would be used by the microcomputer to generate a correction value based on total discharge current, i.e. the sum of the currents supplied to the pump motor and to the traction motor. However, one embodiment of the battery state of charge indicator does not include sensor 31, despite its use in a system incorporating a pump motor. The correction value, used to derive the approximated state of charge, is instead derived from the output of sensor 24, i.e. a value representative of traction motor current. This avoids the cost of a separate sensor 31 since sensor 24 is required for other, i.e. motor control, purposes. This sensed value of current does not account for pump motor current, being based on the traction motor current instead of the total discharge current. Similarly the values of battery terminal voltage, used for deriving the approximated state of charge, are based on traction motor current. The effects of pump motor current on battery terminal voltage are filtered out, as described below. Thus the approximated battery discharge is based on sensed values of current and battery terminal voltage that exclude the effects of pump motor current. The additional battery discharge due to the pump motor current is merely estimated. This is achieved by appropriately reducing the value indicative of internal resistance. This reduces the correction voltage and thus the approximated value of the state of charge. The indicated state of charge is thereby decremented at a faster rate to provide for the estimated discharge due to pump motor current. As noted above, the reduction of actual battery terminal voltage due to pump motor current is effectively filtered out. This is achieved as follows. The vehicle is usually stationary when the pump motor is utilized for any extensive period of time. Droop of battery terminal voltage during such intervals is neglected by disabling the decrementing of the indicated state of charge during the absence of traction motor current. While the vehicle is moving the pump motor is generally used only for brief time intervals. The droop of battery terminal voltage due to pump motor current during vehicle travel is filtered out since the time interval of pump use is short with respect to the 18 second interval between decrements.

The various control functions are implemented in microcomputer 40 which receives control inputs, including those previously described, and provides appropriate control signals on its output lines. As described it may be desirable from time to time to modify certain data values that are stored in memory unit 74 and are used in the program providing the state of charge indication, such as the internal resistance value. This may be achieved by an input device 41 connected to the microcomputer. Device 41 may be a keyboard input device for entry of a desired value into a desired register or address. Devices of such type are well known in the art. Separate output lines are connected, respectively, as follows: to chopper control unit 13 for controlling the mark space ratio of chopper 14; to driver 65 for energizing coil 64 to actuate reverse contacts R1 and R2; to driver 63 for energizing coil 62 to actuate forward contacts F1 and F2; and to pump control driver 37 to energize pump coil 39 to actuate the pump motor 32, 33. Battery state of charge indicator 29 is supplied with a state of charge indication signal by microcomputer 40. This may be a binary coded signal representative of the percentage of the state of charge. Indicator 29 may be a liquid crystal display device or a similar display device having appropriate driver circuitry for displaying the state of charge signal in alpha numeric form. In an electric vehicle, such as a fork lift truck, it is preferably monted on a front dashboard of the vehicle.

MICROCOMPUTER CONTROL

Figure 3:
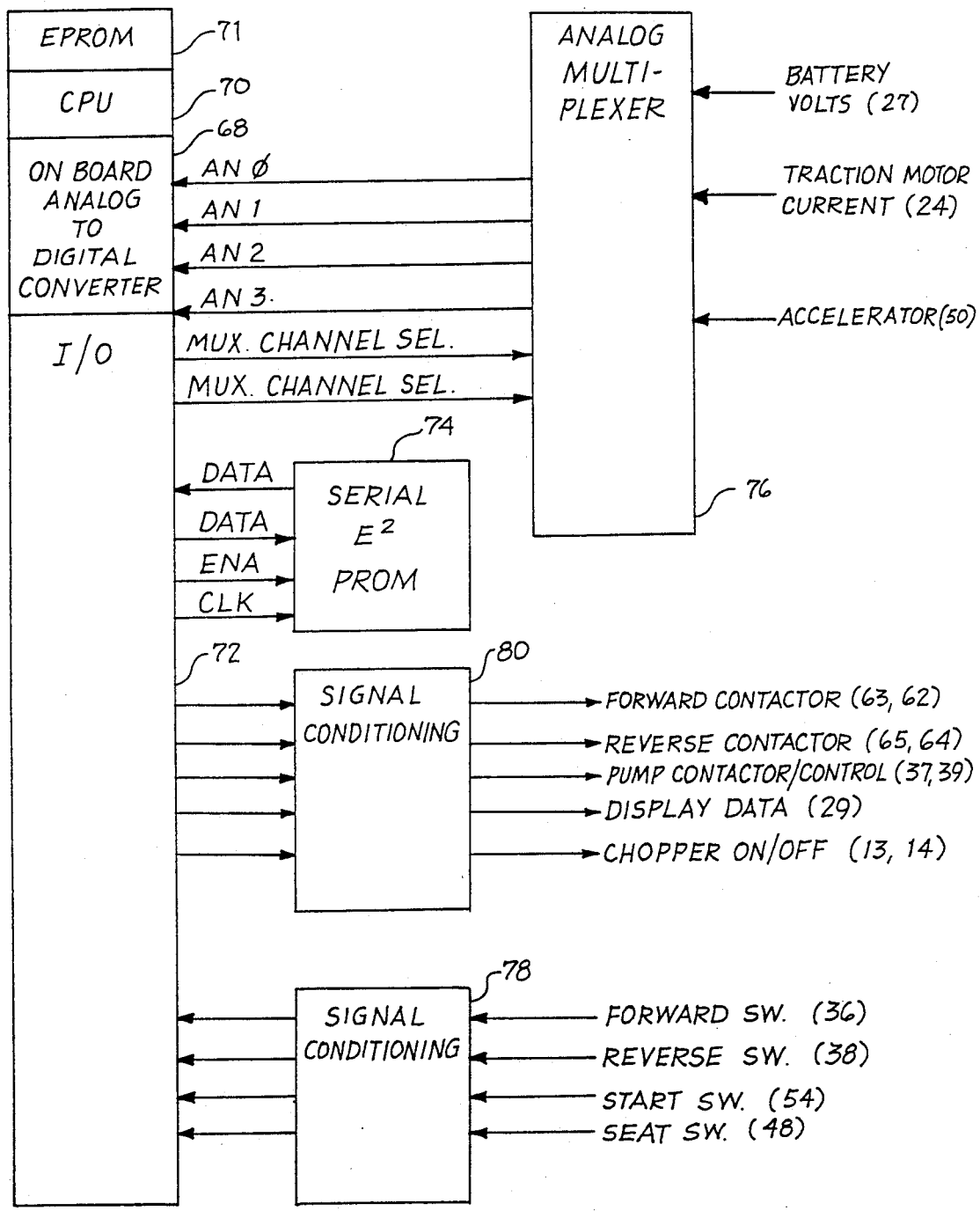
FIG. 3 illustrates the input/output configuration of the microcomputer system used in the battery load circuit.

FIG. 3 illustrates the microcomputer 40 in more detail including those of its inputs and outputs that are of special relevance with respect to the battery state of charge indicator and the above described features of the control system. In the preferred embodiment microcomputer 40 comprises a microprocessor 67, a memory unit 74, analog multiplexer 76 and signal conditioning units 78 and 80. Microprocessor 67, a Motorola MC 68705 R5, contains an analog to digital ("A/D") converter 68, an internal EPROM memory 71 which stores the application program for running microprocessor functions, microrocessing unit ("CPU") 70 and associated input and output ("I/O") terminals 72. The external memory unit 74 is a serial EEPROM, National NMC 9306, which stores necessary data, such as stored constant values. It has data input, data output, enable and clock inputs connected to the I/O terminals of the microprocessor. Data can be stored in selected internal registers either by being preprogrammed or by being written into the memory by the microprocessor via the data input line. Similarly data can be read out to the microprocessor via the data output line. Commands, to read or write data to or from selected registers, are entered via the data input line. Analog multiplexer, or signal conditioner, 76 comprises two dual 4 channel Motorola MC 14052 multiplexer units which receive up to 16 analog signals for selective transfer over lines AN0, AN1, AN2 and AN3 to A/D converter 68. Multiplexer 76 also contains appropriate circuitry for scaling the analog signals applied to the MC 14052 units so that they are in the appropriate voltage range, e.g not in excess of 5 volts. Analog signals to be transferred are selected by the MUX channel select lines connected from the I/O terminals to the multiplexers. Relevant analog input signals that are coupled via multiplexer 76 to the A/D converter include the following: battery volts supplied on line 27, traction motor current (Ia) supplied from sensor 24 or if desired from sensor 31, and the accelerator signal from accelerator potentiometer 50.

Signal conditioning unit 78 represents the interface circuitry between the I/O terminals of the microprocessor and the signal inputs which are of a digital nature, i.e. those signals which represent a switch being opened or closed. As illustrated in FIG. 3 unit 78 receives inputs that permit the microprocessor to monitor the state of the seat switch 48, the start switch 54, the reverse switch 38 and the forward switch 36. Signal conditioning unit 80 represents the interface circuitry between the I/O terminals of the microprocessor and the signal outputs which are of a digital nature, i.e. those signals which command contacts to open or close, which control operation of chopper 14 and which supply the indicated state of charge signal to the display. Thus microprocessor outputs are supplied via driver 63 to coil 62 to actuate forward contacts F1 and F2, via driver 65 to coil 64 to actuate reverse contacts R1 and R2, via driver 37 to coil 39 to actuate pump motor contactor 34, and via chopper control 13 to control chopper 14. The drivers and chopper control use solid state circuitry as generally described in U.S. Pat. No. 4,730,151. In addition the signal representative of the indicated state of charge is provided to discharge indicator 29. Some discharge indicators require externally furnished clock and enable signals in order to display the state of charge data. Such signals can also be provided by the microprocessor in a manner well known in the art.

OPERATION OF THE STATE OF CHARGE INDICATOR

Figure 4:
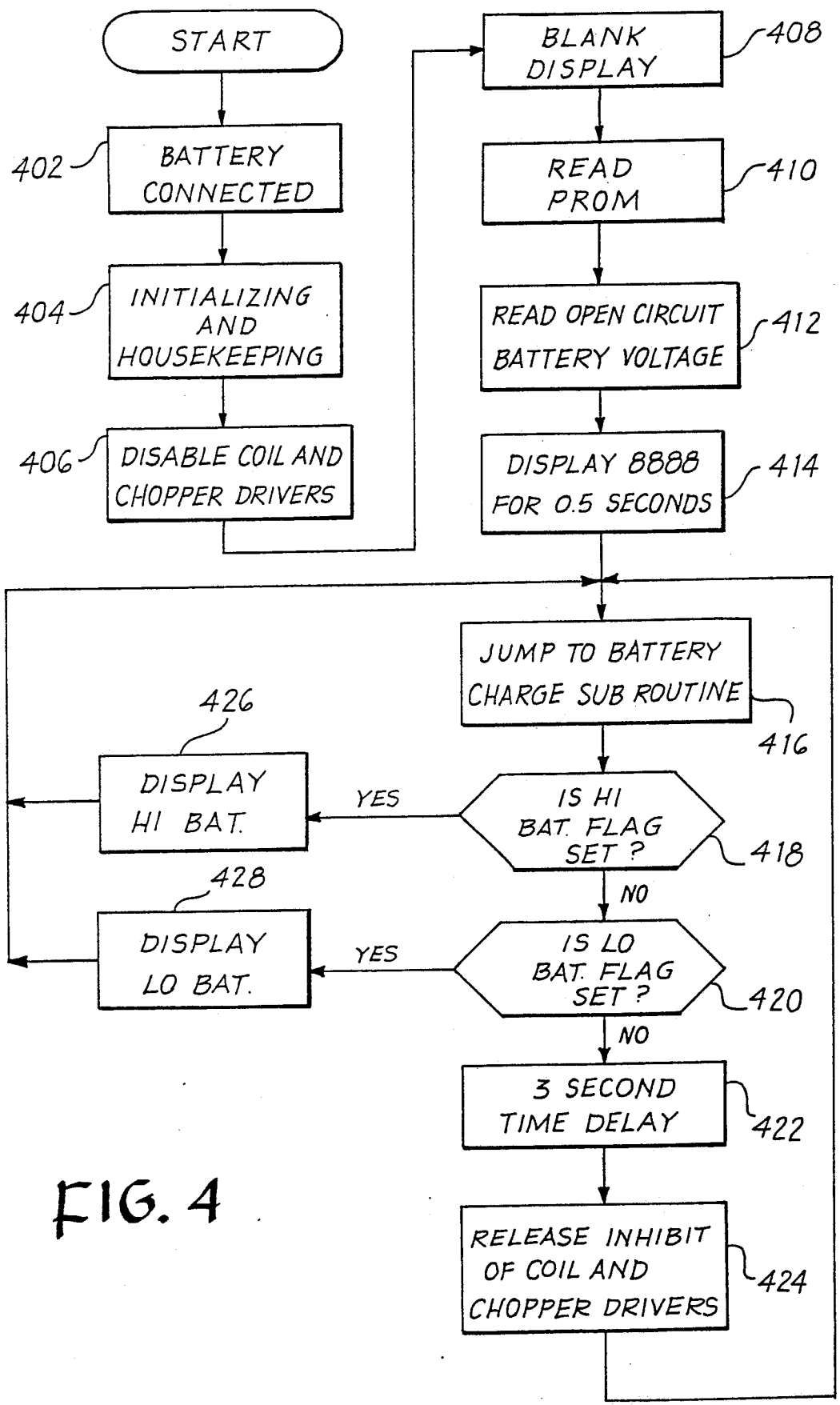
FIG. 4 is a flow chart of the start routine for the state of charge indication program.
Figure 5A:
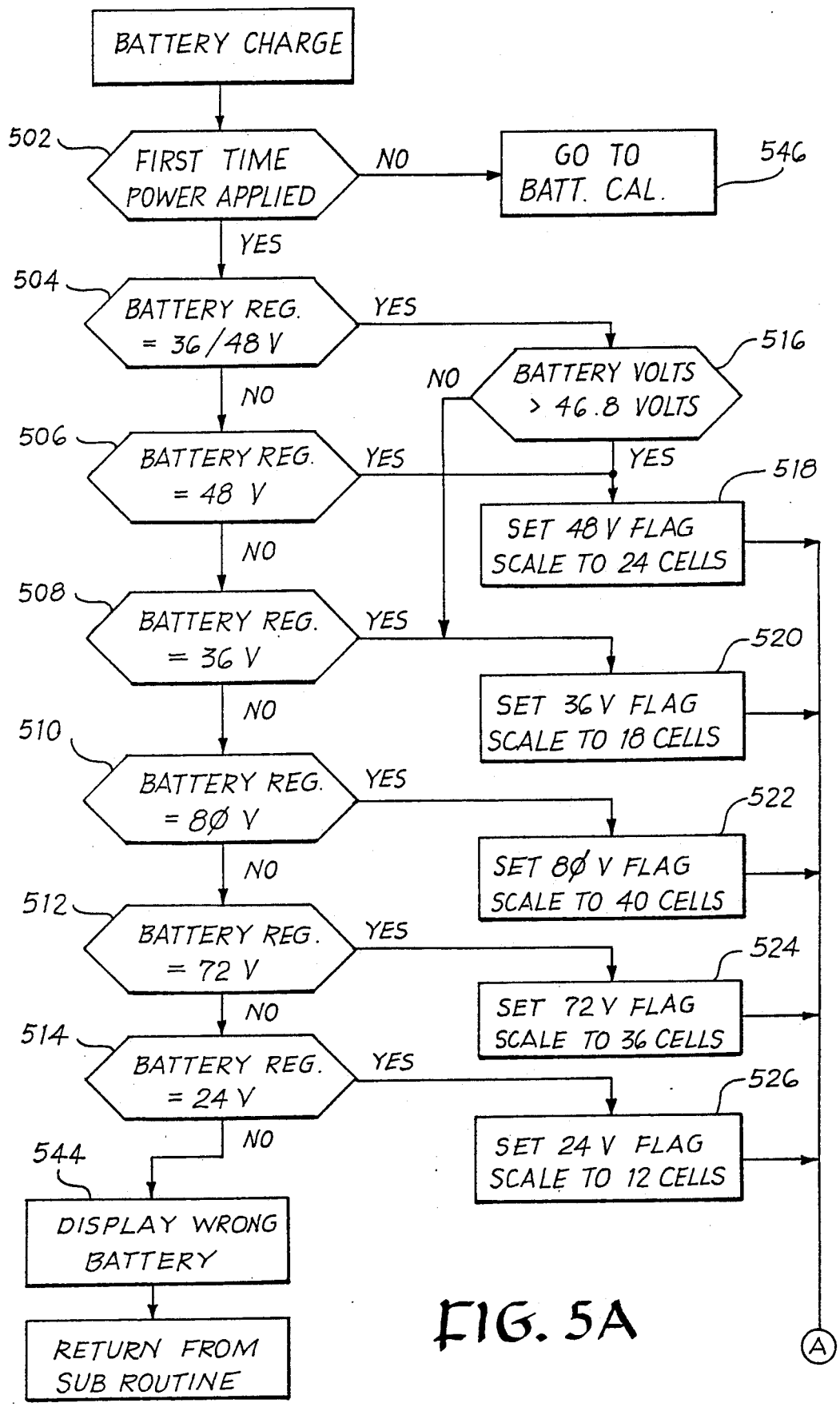
FIG. 5 (FIGS. 5A and 5B) is a flow chart of the subroutine for initiating and setting various parameters of the state of charge program.
Figure 5B:
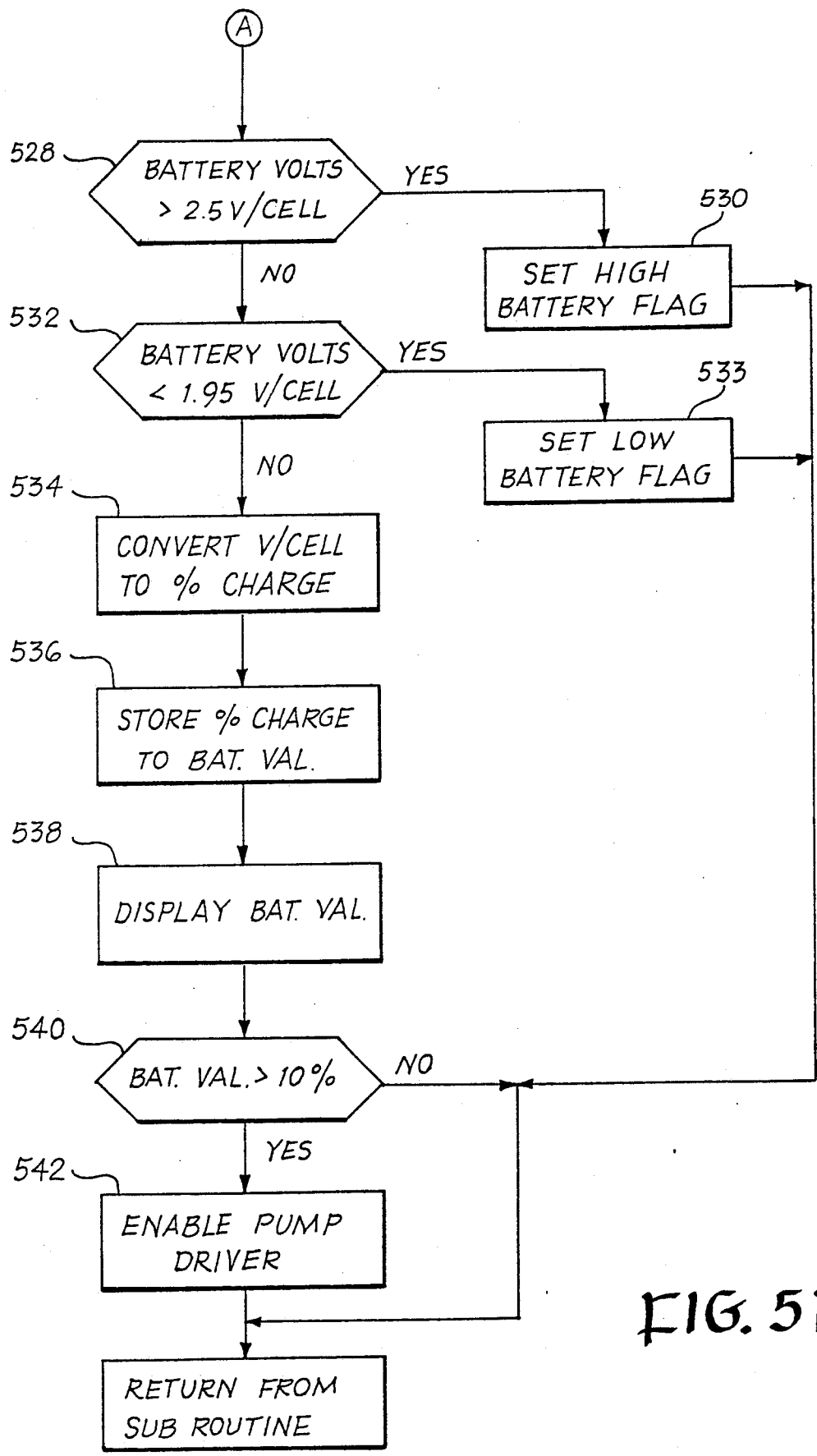
Figure 6:
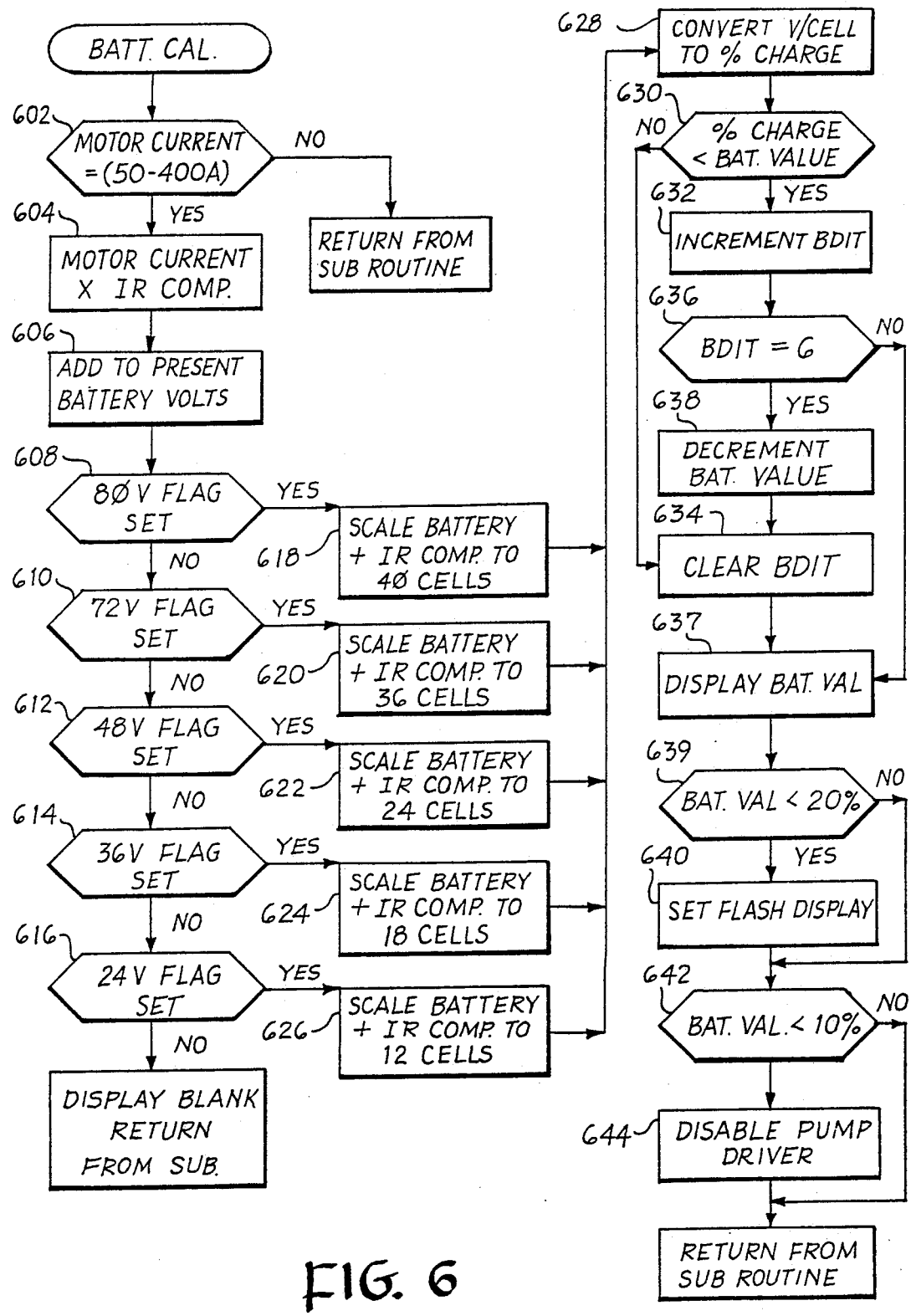
FIG. 6 is a flow chart of a further subroutine for obtaining and displaying the state of charge values.

Operation of the state of charge indicator is illustrated in flow chart form by FIGS. 4-6. Individual blocks of the flow charts are identified by reference numbers and corresponding references in the following text are identified with such number contained in parenthesis. FIG. 4 is a start routine that is run whenever the battery is first connected to the load. In case of the embodiment of FIG. 2 this occurs when the key switch 16 is initially closed. The start routine checks that the batteries are connected (402), initializes the CPU, and performs preliminary housekeeping (404). It initially prevents the load from being connected to the battery by disabling coil drivers 37, 63, 65 and chopper control 13 (406). The display is preferably blanked (408) preparatory to its displaying current data. Stored values of data stored in the serial memory 74 are then read into appropriate registers of CPU 70 (410). These stored values include 1) the internal resistance value, described before, and 2) a value or number representative of the nominal voltage of the type of battery that is specified to be used. This value representative of nominal, i.e. rated voltage can be an arbitrary number, as opposed to a value whose magnitude actually corresponds to the rated voltage. The nominal, i.e. rated voltage differs, of course, from the actually measured battery voltage. It is generally entered, and stored in memory 74, by the manufacturer of the battery's load system, e.g. the electric vehicle manufacturer.

The preferred embodiment uses the value of nominal battery voltage, also referred to as "battery register" or "battery reg" value, for the following reason: The batteries used in various types of load systems and applications have different voltage ratings. For example, different models of fork lift trucks may, for example, use batteries of 80 volts, 72 volts, 48 volts, 36 volts, or 24 volts. The state of charge indication system can be used with all of these battery voltages. System operation, i.e. calculations and use of lookup tables, is simplified by converting measured battery terminal voltage into units of a common parameter, i.e. volts per cell. A single lookup table can then be used to convert the battery voltage, expressed in volts per cell, to a value, based on the specific gravity of the electrolyte, which is representative of the percentage of remaining battery charge. The value of nominal battery voltage is used to convert the battery terminal voltages into values representative of volts per cell.

The battery terminal voltage under open circuit conditions is then measured and stored (412). Thus the scaled value of the actual battery voltage, on line 27, is applied to the input of the A/D converter 68 and the corresponding digital output value of the A/D is stored. This stored value, representative of battery voltage under no load, is subsequently converted to represent the initial value of indicated state of charge. If desired the display can be activated to permit visual confirmation that it is operating correctly. In the preferred embodiment which uses a conventional display of the type having seven segments for each number, the numeral 8 is briefly displayed for each of the number positions of the display (414). This provides an operational check of all segments.

The start routine then jumps to the "battery charge" subroutine (416). This subroutine provides for scaling battery voltage values to values of volts per cell, for reasons described above. The subroutine additionally converts the initially measured, i.e. open circuit, battery terminal voltage to a cell voltage, i.e. volts per cell and to a percentage of battery charge.

The battery charge subroutine, which is subsequently described, also performs some other functions. It determines whether the battery's cell voltage is out of tolerance. Thus, it sets a high battery flag if the cell voltage is excessive, e.g. greater than 2.5 volts per cell. Similarly, it sets a low battery flag if the cell voltage is too low, e.g. less than 1.95 volts per cell. Upon completion of the battery charge subroutine, the status of these flags is checked sequentially. As shown in FIG. 4, upon completion of the battery charge subroutine, the start routine initially checks the status of the high battery flag (418). If it is set, a high battery indication is displayed on indicator 29 (426). If it is not set, the status of the low battery flag is determined (420). If the low battery flag is set, a low battery indication is displayed on indicator 29 (428). If the battery cell voltage is within tolerance, certain functions are performed such that a time interval of up to three (3) seconds is consumed (422). This may include certain checks and operations pertaining to functions of the system that do not directly pertain to the battery state of charge indicator. For example, this can include testing the status of seat switch 48 and of start switch 54.

The coil and the chopper drivers need no longer be disabled and their state of being inhibited from operating is released (424). It will be recalled that one of the functions of the start routine is to read the battery terminal voltage under no load conditions (412). For this purpose, the load had to be kept disconnected until the terminal voltage measurement was taken and stored. This was accomplished by disabling the operation of the coil and chopper drivers (406). Now operation of these drivers is no longer inhibited (424), so that the loads can be connected and operated. Finally, the subroutine loops back to the entry of the battery charge subroutine (416). Thus, the preliminary steps of the start routine (402-414) are not repeated. They are performed only once when the key switch 16 is initially turned on. Thereafter, during normal operation, the program will sequentially loop through the steps identified in FIG. 4 as 416-424. In the preferred embodiment the time delay of this loop is about three seconds. Thus, the battery charge subroutine is entered approximately once every three seconds. The battery charge subroutine performs additional initialization and set up functions, which are described subsequently. These are performed only once initially when the entire start routine is run. Thereafter when the battery charge subroutine is entered (416), a check performed in the latter subroutine causes the program to branch immediately to the "Battery Cal" subroutine. That subroutine, which is described later, performs the previously described steps of comparing the stored charge value, i.e. a stored value indicative of actual state of charge, with the approximated state of charge value, i.e. a value based on actual battery voltage which is corrected for the drop in battery voltage due to discharge current flow. The battery charge subroutine, and thus the above described comparison occurs once every three seconds, i.e. during each entry of the "Battery Cal" subroutine. Even though the subroutine is repetitively entered during operation, it is run only once when called by the start routine upon initiation of operation. A "first time power applied" flag bit is then set. Upon each initiation of the subroutine the status of this flag bit is checked (502). If the flag bit is set, i.e. the subroutine has been run before, operation branches to the "Battery Cal" subroutine, which is discussed subsequently. If the flag bit is not set, the "Battery Charge" subroutine continues to run. The nominal voltage value of the battery is identified by sequentially comparing the stored value of nominal battery voltage, also referred to as the "battery reg." value, with different standard voltage values until a match is found (504-512). As illustrated in FIG. 5, these comparisons are made sequentially, until a match is found, with the following battery ratings: 36/48 volt (504), a designation conveying that either a 36 volt or a 48 volt battery may be used; 48 volt (506); 36 volt (508); 80 volt (510); 72 volt(512) and 24 volt (514). If a battery with the wrong terminal voltage is installed, there will be no match. In that case operation of the state of charge indicator is terminated, subsequent to an appropriate display on indicator 29 (544). If the battery reg value matches the value for 36 volt/48 volt, i.e. that either a 36 volt or a 48 volt battery is acceptable, a determination is made as to whether a 36 volt or a 48 volt battery is installed (516). This is done by testing whether the battery terminal voltage is greater than 46.8 volts. If so the installed battery is assumed to be the 48 volt type, and a 48 volt flag bit is set (518). If the terminal voltage does not exceed 46.8 volts, a 36 volt flag bit is set (520). Thus the appropriate flag is set to identify the nominal voltage value of the installed battery from one of the following: 48 v (518); 36 v (520); 80 v (522); 72 v (524) and 24 v (526).

The appropriate scale is now set to convert values representative of battery terminal voltage to values representative of battery cell voltage. In the preferred embodiment scaling is based on a nominal cell voltage of two volts. Thus it is assumed that the number of cells per battery is equal to the nominal battery voltage divided by two. As shown in FIG. 5, the number of assumed cells is set, based on the nominal battery voltage, as follows: 48 v=24 cells (518), 36 volts=18 cells (520), 80 v=40 cells (522), 72 v=36 cells (524) and 24 v=12 cells (526). For example, if the 48 v flag is set, battery voltages will be divided by 24 to provide the appropriate cell voltage. For this purpose a value representative of the number of cells may be stored in a register of the CPU, and the previously stored value of battery terminal voltage, under open circuit conditions, is converted to a cell voltage, i.e. volt per cell value, identified as "battery volts". A check is then made of whether the cell voltage is within acceptable limits. If this cell voltage substantially exceeds the normal value of a fully charged cell, e.g. is greater than 2.5 volts (528), a "high battery" flag is set (530) and operation of the state of charge indicator is discontinued. This flag is used to display an indication that the battery voltage is excessive. If, instead, the cell voltage is substantially below the normal value of a fully discharged cell, e.g. is less than 1.95 volts (532), a "low battery" flag is set (533). Operation of the indicator is discontinued, and a low battery voltage indication is displayed.

If the cell voltage is within bounds, it is converted to a value corresponding to the percentage of charge of the battery (534). In the preferred embodiment this conversion is performed with a lookup table. This percent charge value is stored as "bat val" (536) and displayed on the state of charge indicator 29 (538). "Bat val" thus is the percentage of charge of the battery that is displayed on indicator 29. In the preferred embodiment it is displayed as a three digit value ranging from zero to 100 percent, wherein a 100 percent reading results from any cell voltage ranging from 2.4 volts to the limit value of 2.5 volts, and a zero reading results from a cell voltage of 1.95 volts or less. The relationship between cell voltage and the percentage of charge is substantially linear over the above defined voltage range. Finally, certain auxiliary loads may be disabled to save energy if the percentage of charge is extremely low. In this case the auxiliary load comprises pump motor 32, 33. For this purpose a determination is made whether "bat val" is greater than 10% (540). If "bat val" is greater than 10%, operation of the pump motor is enabled (542).

As described above the "battery charge" subroutine of FIG. 5 is entered once every three seconds. Upon entry a flag bit check is made whether the subroutine has been run before. In the event it has been run before, the program branches to the "batt cal" subroutine (546). The "batt.cal" subroutine, shown in FIG. 6, performs most of the calculations and steps set forth in the introductory portion of the Detailed Description. To recapitulate, during normal operation, when there is battery discharge current, the value representative of actual battery terminal voltage is modified to compensate for the drop in battery voltage due to discharge current. Specifically a correction voltage value is added that comprises the product of an internal resistance value and a value representative of load or traction motor current. A scaled value of traction motor current is provided by sensor 24 to the microprocessor and is utilized in the first step of the batt cal routine (602). As previously described, the battery terminal voltage decreases with increases in discharge current. This inverse relationship is approximately linear over the normal range of discharge currents. However, at extremely high discharge currents the relationship becomes non-linear, such that the voltage droop is greatly exaggerated. This could result in inacurate and excessive discharge indications. In the preferred embodiment, state of charge calculations are performed only if the traction motor current is below a specified value, e.g. 400 amps. Conversely, in the preferred embodiment state of charge calculations are performed only if there is some traction motor current. Since resolution of sensed current decreases at very low magnitudes of discharge current, state of charge calculations are performed only when traction motor current exceeds a predetermined value, e.g. 50 amps. If the motor current is outside of these minimum and maximum values, the subroutine is terminated (602). The maximum and minimum values are stored in memory so that they can be readily changed.

Next the value of motor current is multiplied by the value of internal resistance, also referred to as the "IR compensation value", which is stored in memory 74 (604). The resulting product, the correction voltage, is then added to the value representative of actual, i.e. present, battery voltage (606). The sum of the correction voltage and of the actual battery voltage values is the corrected battery voltage value that approximates the actual state of charge of the battery. The corrected battery voltage value is then converted to a cell voltage value, for reasons described in connection with the scaling steps of FIG. 5. For this purpose the nominal voltage of the installed battery is identified by determining whether its voltage flag is set for 80 volts (608); 72 volts (610); 48 volts (612); 36 volts (614) or 24 volts (616). Scaling is performed similarly to the scaling steps of FIG. 5, based on a nominal cell voltage of two volts. Thus the assumed number of cells equals the nominal battery voltage divided by two. The corrected battery voltage value is thus divided by the assumed number of battery cells, i.e. it is divided by one half of the battery's nominal voltage, to derive the corrected cell voltage. This is shown by steps 618 to 626, wherein the corrected battery voltage is referred to as "battery+IR comp". Finally the corrected cell voltage is converted to an approximated state of charge value which is representative of the percentage of charge, and which is also referred to as "% charge" (628). This latter value is used to modify the value of indicated state of charge, "bat val", which is displayed on indicator 29.

The following steps decrement "bat val" the stored charge value used to indicate the state of charge on indicator 29. "Bat val" is decremented as a result of its value being greater than the value of "% charge", the value based on the corrected voltage. Thus the values of "% charge" and of "bat val" are compared (630). If "% charge" is less than "bat val", a counter called "battery discharge indicator timer" or "BDIT" is incremented by one count (632). Conversely, if "% charge" is not less than "bat val", the "BDIT" counter is cleared to zero (634). The count in the "BDIT" counter is then checked (636). If the count is less than six the digital value of "bat val" is transmitted to indicator 29 for display (637). However, when the "BDIT" count is incremented to six, the value of "bat val" is decremented by one count (638). In this arrangement "bat val" is scaled so that one hundred counts is equivalent to an indication of full, i.e. 100% battery charge. Thus when "bat val" is decremented by one count, the indicated state of charge is reduced by one percent. "Bat val" is decremented only upon it being greater than "% charge" in six consecutive loops of the "batt cal" subroutine. If "bat val" is not found to be greater than "% charge" during any loop, the "BDIT" counter is reset to zero. The preferred embodiment makes no provisions for incrementing the indicated state of charge, i.e. "bat val", notwithstanding apparent increases in the value of "% charge". Thus no provision is made to increment the indicated state of charge during regenerative braking when discharge current is reversed. The specific arrangement for decrementing the indicated state of charge could be modified as required for specific applications, and provision could be made to increment the indicated state of charge under certain circumstances. If the value of "bat val" is found to be less than 20% charge (639), a control input signal is transmitted to indicator 29 to produce a flashing display of the indicated state of charge (640). This is to attract the attention of the operator. If the value of "bat val" is found to be less than 10% charge (642), driver 37 for the pump motor is disabled (644). This optional feature shuts off the auxiliary load to reduce the rate of battery discharge so that the operator has a greater chance to return the vehicle to its base prior to complete discharge of the battery. This completes the description of the "batt cal" subroutine It should be apparent to those skilled in the art that while the preferred embodiment has been described in accordance with the Patent Statutes, changes may be made in the disclosed embodiment without actually departing from the true spirit and scope of the invention.

What we claim as new and desire to secure by Letters Patent of the United States is:

1. A method for providing a representation of the state-of-charge of a battery supplying discharge current to a load circuit under conditions when battery discharge current is subject to magnitude variations, comprising the steps of:
   (a) before connection of the load circuit to the battery:
   (a1) deriving a first value which is representative of battery terminal voltage under no load conditions;
   (a2) storing the first value as a stored charge value indicative of the remaining charge of the battery;
   (b) during connection of the battery to the load circuit:
   (b1) deriving terminal voltage values representative of the battery terminal voltage under present load conditions;
   (b2) sensing values of discharge current under present load conditions and deriving therefrom correction voltage values representative of the present reduction of terminal voltage due to the sensed discharge current;
   (b3) deriving approximated state of charge values representative of the sum of the terminal voltage values and of the correction voltage values: and
   (b4) decrementing the stored charge value by a predetermined increment as a function of the stored charge value exceeding the approximated state of charge values.

2. The method of claim 1 comprising the steps of:
   (a) periodically deriving and adding the terminal voltage values and the correction voltage values to derive the approximated state of charge values:
   (b) periodically comparing the approximated state of charge values with the stored charge value; and
   (c) decrementing the stored charge value in response to the stored charge value having exceeded the approximated state of charge values during a predetermined plurality of comparisons.

3. The method of claim 2 wherein the stored charge value is decremented only upon the stored charge value having exceeded the approximated state of charge values during each of a predetermined plurality of consecutive comparisons.

4. The method of claim 3 wherein each decrement of the stored charge value reduces the stored charge value by a predetermined percentage of the difference between the stored charge values representative of fully charged and of fully discharged conditions.

5. The method of claim 1 wherein the correction voltage values are derived by the step of multiplying the values of sensed discharge current by a resistance value approximating the internal resistance of the battery.

6. The method of claim 5 wherein the resistance value is stored in a register.

7. A method for providing a representation of the state-of-charge indication of any of claims 1 to 6 on a display device, comprising the further step of sequentially providing the stored charge value to the display device for display of the remaining state of charge of the battery.

8. A method for providing a representation of the remaining state of charge of a battery supplying discharge current to a load circuit, comprising the steps of:
 (a) providing digital storage means for storing a value of stored charge indicative of the remaining state of charge of the battery and for storing a resistance value approximating the internal resistance of a battery and further providing a display device adapted to display the state of charge in response to a signal representative of the stored charge value;
 (b) before connection of the load circuit to the battery sensing the value of battery terminal voltage and deriving therefrom and storing a value of stored charge indicative of the state of charge of the battery;
 (c) subsequent to connection of the load circuit to the battery periodically:
 (c1) sensing a value of battery discharge current, deriving a value of correction voltage representative of the product of the value of battery discharge current and of the stored resistance value;
 (c2) sensing the value of battery terminal voltage and deriving an approximated state of charge value corresponding to the sum of the values of battery terminal voltage and of correction voltage;
 (c3) comparing the values of stored charge and of approximated state of charge and decrementing the value of stored charge as a function of the value of stored charge exceeding the value of approximated state of charge; and
 (d) providing on the display an indication of the remaining state of charge corresponding to the value of stored charge.

9. A method for controlling the motors of a traction vehicle, comprising the steps of:
 providing digital storage means for storing a value of stored charge indicative of the remaining state of charge of the battery and for storing a resistance value approximating the internal resistance of a battery and further providing a display device adapted to display the state of charge in response to a signal representative of the stored charge value;
 before connection of the load circuit to the battery sensing the value of battery terminal voltage and deriving therefrom and storing a value of stored charge indicative of the state of charge of the battery;
 subsequent to connection of the load circuit to the battery periodically:
 sensing a value of battery discharge current, deriving a value of correction voltage representative of the product of the value of battery discharge current and of the stored resistance value;
 sensing the value of battery terminal voltage and deriving an approximated state of charge value corresponding to the sum of the values of battery terminal voltage and of correction voltage;
 comparing the values of stored charge and of approximated state of charge and decrementing the value of stored charge as a function of the value of stored charge exceeding the value of approximated state of charge;
 providing on the display an indication of the remaining state of charge corresponding to the value of stored charge
 providing digital processing means;
 operating the digital processing means during a first set of time intervals to provide the values of stored charge; and
 operating the digital processing means during a second set of time intervals for controlling the electric traction motor means and thus the tractive effort of the vehicle.

10. A method for controlling the motors of a traction vehicle, comprising the steps of:
 providing digital storage means for storing a value of stored charge indicative of the remaining state of charge of the battery and for storing a resistance value approximating the internal resistance of a battery and further providing a display device adapted to display the state of charge in response to a signal representative of the stored charge value;
 before connection of the load circuit to the battery sensing the value of battery terminal voltage and deriving therefrom and storing a value of stored charge indicative of the state of charge of the battery;
 subsequent to connection of the load circuit to the battery periodically:
 sensing a value of battery discharge current, deriving a value of correction voltage representative of the product of the value of battery discharge current and of the stored resistance value;
 sensing the value of battery terminal voltage and deriving an approximated state of charge value corresponding to the sum of the values of battery terminal voltage and of correction voltage;
 comparing the values of stored charge and of approximated state of charge and decrementing the value of stored charge as a function of the value of stored charge exceeding the value of approximated state of charge;
 energizing the traction and pump motor means from a common source of battery;
 providing a source of traction current signals representative of the magnitude of current flow in the traction motor means; and
 using the traction current signals in controlling energization of the traction motor means and also using the traction current signals as the value of battery discharge current in deriving the value of correction voltage used for obtaining the approximated state of charge of the battery.

* * * * *